United States Patent [19]

Fujii

[11] Patent Number: 4,697,095

[45] Date of Patent: Sep. 29, 1987

[54] CHIP-ON-CHIP SEMICONDUCTOR DEVICE HAVING SELECTABLE TERMINAL CONNECTIONS

[75] Inventor: Shigeru Fujii, Yokohama, Japan

[73] Assignee: Fujitsu Limited, Kawasaki, Japan

[21] Appl. No.: 782,931

[22] Filed: Oct. 2, 1985

[30] Foreign Application Priority Data

Oct. 5, 1984 [JP] Japan .................. 59-209236

[51] Int. Cl.[4] ........................................ H03K 17/693
[52] U.S. Cl. ...................... 307/243; 307/465; 307/475; 307/585; 307/303; 324/73 R; 340/825.83; 357/75; 371/15
[58] Field of Search ............. 357/75; 340/825.22, 340/825.83; 324/73 R, 158 R; 307/443, 446, 448, 465, 468, 475, 510, 540, 568, 243, 572, 573, 575, 577, 580, 584, 296 R, 303, 200 B, 451, 585; 371/15

[56] References Cited

U.S. PATENT DOCUMENTS

| | | | |
|---|---|---|---|
| 4,055,754 | 10/1977 | Chesley | 324/73 R X |
| 4,071,902 | 1/1978 | Eichelberger et al. | 324/73 R X |
| 4,103,182 | 7/1978 | Bradley | 307/465 |
| 4,350,906 | 9/1982 | Gillberg | 307/443 X |
| 4,446,390 | 5/1984 | Alaspa | 307/243 X |
| 4,509,008 | 4/1985 | DasGupta et al. | 324/73 R |
| 4,550,289 | 10/1985 | Kabashima et al. | 324/158 R |
| 4,558,447 | 12/1985 | Freeman et al. | 324/73 R X |
| 4,612,499 | 9/1986 | Andresen et al. | 324/73 R |

FOREIGN PATENT DOCUMENTS 0094756 5/1985 Japan ..................... 357/75

OTHER PUBLICATIONS

Kraynak et al., "Wafer-Chip Assembly for Large-Scale Integration", IEEE Trans. Elect. Devices, vol. ED-15, No. 9, 9-1968, pp. 660-663.
"Bipolar-FET Package Design", IBM T.D.B., vol. 28, No. 2 L, Jul. 1985, p. 523.

*Primary Examiner*—Stanley D. Miller
*Assistant Examiner*—D. R. Hudspeth
*Attorney, Agent, or Firm*—Staas & Halsey

[57] ABSTRACT

A circuit configuration in a chip for a semiconductor device based on so-called chip-on-chip technology. The chip has a selecting circuit which switches, according to the control signals supplied thereto, an input of an internal circuit formed on the chip to connect to an output of the internal circuit or to an input terminal for receiving signals from another chip with which the chip is to be interconnected in a completed chip-on-chip structure. The control signals to operate the selecting circuit can be supplied without using large terminals to be connected to an external circuit, by simple impedance means and biasing means respectively provided for the chip and the other chip.

15 Claims, 7 Drawing Figures

CHIP-ON-CHIP SEMICONDUCTOR DEVICE HAVING SELECTABLE TERMINAL CONNECTIONS

BACKGROUND OF THE INVENTION

The present invention relates to a semiconductor device based on the so-called chip-on-chip technology, and in particular to a circuit configuration on a chip constituting the device.

In the trend of increasing versatility and packing density in large scale integration (LSI) semiconductor devices, demands for incorporating various circuits different in their functions in an LSI package are increasing. However, it is difficult to integrate circuits, which are usually fabricated according to different technologies, on a common semiconductor substrate today. Such difficulty generally arises in the combinations of a MOS (metal oxide semiconductor) or CMOS (complementary MOS) type circuit and a bipolar type circuits; the combinations including a CMOS (complementary MOS) circuit and a TTL (transistor-transistor logic) circuit, a CMOS digital circuit and an analog integrated circuit such as an A/D (analog-to-digital) or D/A (digital-to-analog) converter, and a CMOS circuit and an ECL (emitter coupled logic) circuit. In principle, such a combination might be possible in a semiconductor chip. However, the benefits provided by the combination could not compensate for the probable complexities in the processes to produce it, and further, the expected yield of products provided by the combination would be extremely low.

Chip-on-chip technology has been proposed as a means for allowing such combinations while retaining the advantages of the existing MOS and bipolar technologies as they are. That is, individual semiconductor chips having respective different technology circuits such as mentioned above are combined in a stacked structure and provided with wirings for interconnecting them via respective corresponding terminals formed thereon. Generally, the upper chip is smaller than the lower chip. With the introduction of a chip-on-chip structure, each chip can be fabricated in the respective optimized processes as employed for the conventional MOS, CMOS or bipolar semiconductor device.

FIG. 1 is a perspective view illustrating a conceptual structure of a chip-on-chip semiconductor device. Referring to FIG. 1, a small semiconductor chip 200 (second chip) having an internal circuit (second internal circuit, namely a which is not shown) is mounted on a larger semiconductor chip 100 (first chip) having another internal circuit (first internal circuit which is not shown). A number of terminals 101 are formed at the peripheral region of the first chip 100. These terminals 101, each having a relatively large size of 100 micron square, for example, are used for the connections to the external circuits or power sources. At the inner region of the first chip 100 are formed a number of smaller terminals 102, each having a size of 10 micron square, for example. The terminals 102 are used for the interconnections between the chips 100 and 200. For instance, data signals output from the chip 100 to the chip 200 or input to the chip 100 from the chip 200 are transmitted through the terminals 102. Further, control signals or power voltages are supplied to the second internal circuit via the terminals 102. Therefore, each of the terminals 102 is wired to a corresponding terminal 201 on the second chip via a corresponding one of wiring lines 202. Each of the wiring lines 202 may be a thin film wiring line of aluminum, for example, formed by using conventional thin film and lithographic technologies.

Each of the chips 100 and 200 are subjected to individual functional tests in a separate condition before they are stacked into a chip-on-chip structure. Therefore, it is required that each of the chips 100 and 200 be provided with a circuit configuration allowing for individual testing. This involves two requirements: (1) since the output of each of the first and second internal circuits is open circuited during the individual test, any means to take out output signals from the internal circuit must be provided for each of the chips 100 and 200 to be tested by an external test circuit; and (2) in the internal circuit formed on a chip based on MOS technology, MOS transistors or CMOS inverters are generally used as the input means. The gates of these MOS transistors or CMOS inverters must tentatively be clamped at respective appropriate potentials so as not to be left floating during the individual test. This is because such floating gate MOS transistors or CMOS inverters are in unidentified logical states and would disturb the operation of the internal circuit, thereby making the test invalid. Moreover, if a number of floating gate CMOS inverters are used as the input means of an internal circuit, the power source or the relevant power supply line would be damaged by the extraordinary excess currents flowing through the floating gate CMOS inverters, because the power source or power supply lines has been designed to comply with the maximum current flowing during the transitions of the CMOS inverters in the normal operation condition. The abovementioned requirements are also applied to the second internal circuit as well, if the circuit on the second chip is fabricated based on the MOS technology.

It is easy to think of providing each of the terminals 102 and 201 with a sufficient area to accommodate a touch of a probe which is tentatively used for the connections between the relevant internal circuit to be tested and an external test circuit or power supply. However, the area of such a terminal is inevitable as large as 100 micron square, as mentioned above, and reduces the chip area to be allotted to device regions. Therefore, it is undesirable to form a number of such large terminals on a chip in view of chip area utilization, particularly, at the inner region of the chip 100 which should be used for forming as many functional elements therein such as transistors as possible.

Thus, it is desired to solve the problem of the tradeoff between the requirements for allowing the individual test prior to the stacking of the chips into an chip-on-chip structure and the reduction in the chip area utilization efficiency.

SUMMARY OF THE INVENTION

It is an object of the present invention to provide a semiconductor device based on a chip-on-chip technology, wherein each of chips constituting the device can be subjected to a test individually in a respective separated condition without reducing the chip area utilization efficiency.

It is another object of the present invention to provide a semiconductor device based on a chip-on-chip technology, wherein the chip area utilization efficiency in the chips constituting the device can substantially be increased and wherein each of the chips can be subjected to a test individually in a respective separated condition.

The above objects can be attained by constituting a semiconductor device by using a first chip and a second chip mounted of the first chip, both chips having a respective internal circuit, wherein the first chip comprises a selecting circuit and a control signal input terminal for receiving a control signal for the selecting circuit. The selecting circuit switches to connect an input of the internal circuit of the first chip, to an output of the internal circuit of the first chip, or to an output of the internal circuit of the second chip according to the control signals supplied for the control signal input terminal.

The above objects can also be attained by forming a semiconductor device of a first chip and a second chip mounted on the first chip, both chips having a respective one internal circuit, wherein the first chip comprises a selecting circuit, a control signal input terminal for receiving a control signal to the selecting circuit, and an impedance means connected between the control signal input terminal and a voltage source, and the second chip comprises a biasing means to be connected to the control signal input terminal of the first chip so as to clamp the control signal input terminal at a predetermined voltage when the interconnections between the first and second chips are completed.

BRIEF DESCRIPTION OF THE DRAWINGS

The above and other related objects and features of the present invention will be apparent from a reading of the following description and claims taken in connection with the accompanying drawings, forming a part of this application, in which:

DESCRIPTION OF PREFERRED EMBODIMENTS

Figure 1:
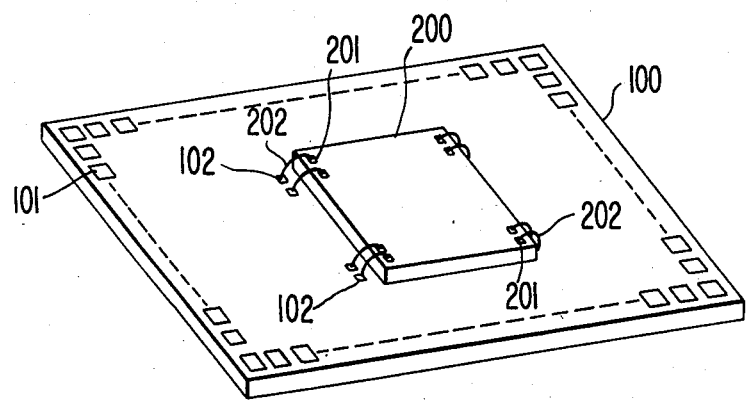
FIG. 1 is a perspective view illustrating a conceptual structure of a chip-on-chip semiconductor device.
Figure 2:
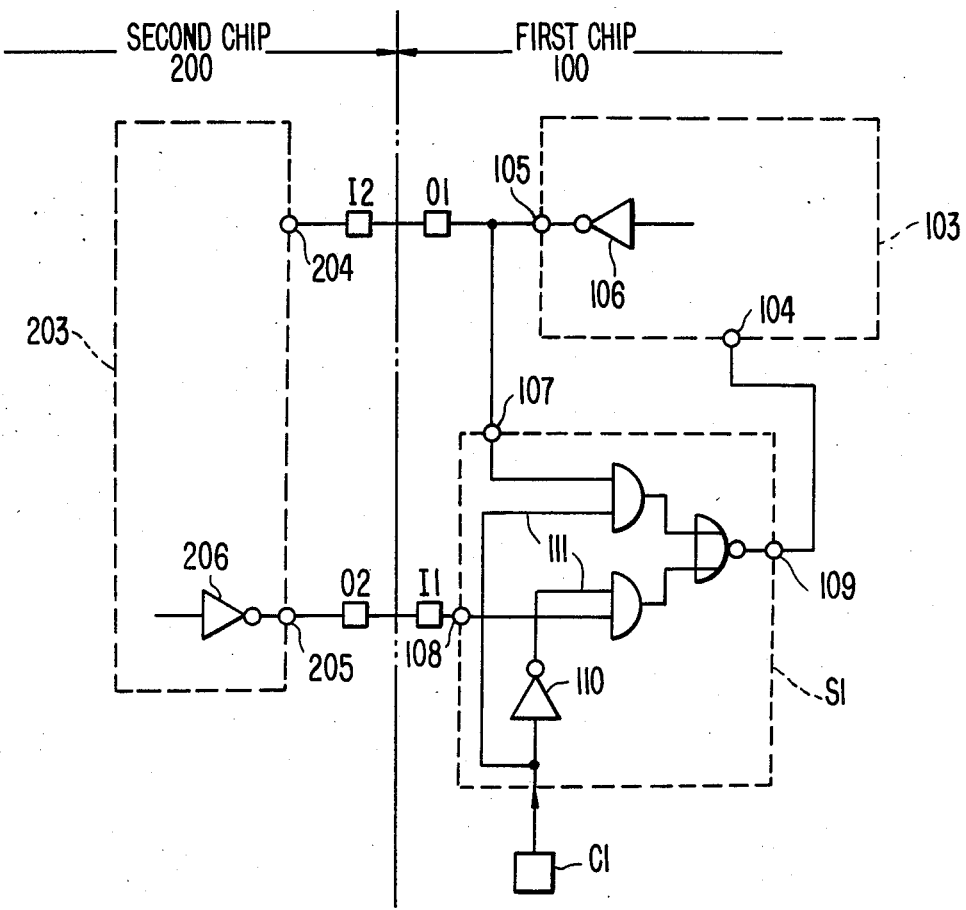
FIG. 2 is a circuit block diagram illustrating an essential part of the circuit of a chip-on-chip type semiconductor device in accordance with the first embodiment of the present invention.

FIG. 2 is a circuit block diagram illustrating an essential part of the circuit of a chip-on-chip type semiconductor device in accordance with the first embodiment of the present invention. In FIG. 2, like numerals designate like or corresponding parts in FIG. 1. The semiconductor device includes a first chip 100 and a second chip 200. The first chip comprises a first internal circuit 103 having an input node 104 and an output node 105 connected to an output buffer 106, an output terminal O1, an input terminal I1, a selecting circuit S1 having two input nodes 107 and 108 and an output node 109, and a control signal input terminal C1 for receiving external control signals to the selecting circuit S1. The second chip 200 comprises a second internal circuit 203 having an input node 204 and an output node 205 connected to an output driver 206, an input terminal I2 and an output terminal O2.

The output nodes 105 and 205 are connected to the respective output terminals O1 and O2, and input node 204 is connected to the input terminal I2. The output terminal O1 and input terminal I2 are respectively formed at the inner region on the first chip 100 and the peripheral region of the second chip and interconnected with each other. Similarly, the input terminal I1 and output terminal O2 are respectively formed at the inner region of the first chip 100 and the peripheral region of the second chip 200 and interconnected with each other.

The input nodes 107 and 108 of the selecting circuit S1 are respectively connected to the output terminal O1 and the input terminal I1, and the output node 109 of the selecting circuit S1 is connected to the input 104 of the first internal circuit 103. The selecting circuit S1 may comprise a well-known AND-OR-inverter gate provided with an inverter 110 connected to one of the control signal input lines 111, as shown in FIG. 2. The control signal input terminal C1 is formed as one of the terminals 101 at the peripheral region of the first chip 100 as shown in FIG. 1.

In the circuit configuration as shown in FIG. 2, when a high level signal is supplied to the control signal input terminal C1, the selecting circuit S1 switches to connect the input node 104 to the output node 105, and a closed loop is established between the output node 105 and the input node 104 of the internal circuit 103. If a signal relative to the incoming signal to the input node 104 is output from the first internal circuit 103 to a terminal 101 formed at the peripheral region of the first chip 100 (see FIG. 1), the operation of the internal circuit 103 in a test mode can be confirmed by an external test circuit (not shown) connected to the terminal 101. Thus, the chip 100 can be subjected to the aforesaid individual test in a separated condition (in which chip 1 is not connected to chip 2) or even in the completed chip-on-chip structure.

On the other hand, when a low level signal is supplied to the control signal input terminal C1, the selecting circuit S1 switches to connect the input node 104 to the input terminal I1. In this case, the output signals from the second internal circuit 203 are transmitted to the input node 104 of the first internal circuit 103, and the chips 100 and 200 can be tested in the completed chip-on-chip structure.

The first internal circuit 103 and second internal circuit 203 have respective pluralities of like output nodes 105 and 205 and input nodes 104 and 204, and therefore the first chip 100 and second chip 200 are provided with respective corresponding pluralities of like output terminals O1 and O2 and input terminals I1 and I2. These output nodes and input nodes of each internal circuit are not always equal in number, and therefore the output and input terminals of each of the chips 100 and 200 are not always formed in one-to-one correspondence. Further, all of the output or input nodes are not always used for the individual testing.

When MOS transistors or CMOS inverters are used for constituting input means, their gates connected to the abovementioned input nodes not used for the individual testing must be clamped at the respective appropriate potential levels so as not to be left floating during the individual testing, because of the reasons as described before. In the circuit configuration of FIG. 2, even if the input node 104 is one of the above inputs not used for individual testing, and is formed from a MOS transistor or CMOS inverter, the gate of the MOS transistor or CMOS inverter is clamped at the level of the output 109 of the selecting circuit S1 during the individual test, the level being determined by the output signals on the output node 105. Thus, the aforementioned problems relating to the floating gate MOS transistor or CMOS inverter can be eliminated.

As obviously understood from the above explanations of the first embodiment, each of the terminals such as the output terminal O1 and input terminal I1, and other input terminals connected to the aforesaid floating gate MOS transistors or CMOS inverters, is made free of the necessity of accommodating a touch of an external probe and can be formed small, such as 10 micron square, for example, at the inner region of the first chip 100.

As for the second chip 200, each of the input terminals I2 and output terminals O2, which are used for the connections to an external test circuit, are formed large such as 100 micron square, for example, so as to accommodate a touch of an external probe. However, other input terminals connected to the aforesaid floating gate MOS transistors or CMOS inverters can be clamped at the respective appropriate potential levels by incorporating a selecting circuit as in the first chip 100, and can be formed small such as 10 micron square, for example. Thus, the chip area utilization efficiency can be increased compared with the chip configuration wherein each of the output and input terminals like O1 and I1 is formed large so as to accommodate a touch of an external probe. It is obvious to those skilled in the art that the chip area necessary to form such a selecting circuit therein is sufficiently small compared with that consumed by a large terminal, such as of 100 micron square, for example.

Figure 3:
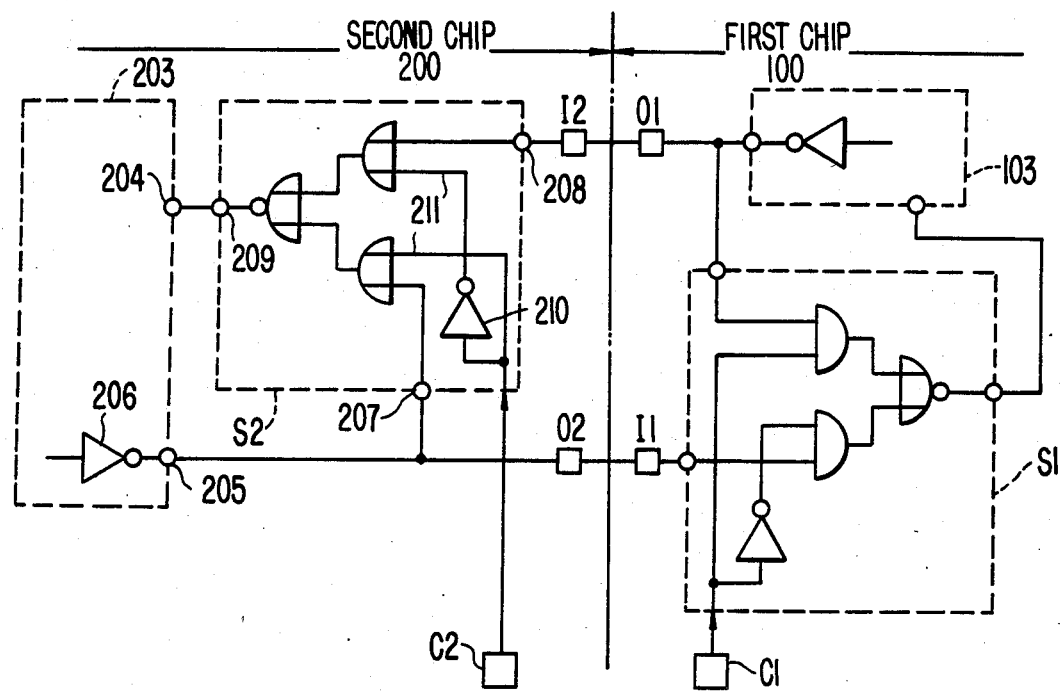
FIG. 3 is a circuit block diagram illustrating an essential part of the circuit of a chip-on-chip type semiconductor device in accordance with the second embodiment of the present invention.

FIG. 3 is is a circuit block diagram illustrating an essential part of the circuit of a chip-on-chip type semiconductor device in accordance with a second embodiment of the present invention, wherein the second chip 200 comprises a second selecting circuit S2 for the purpose of clamping the floating gate of an input MOS transistor or CMOS inverter, as mentioned just above. In FIG. 3, like numerals designate like or corresponding parts in the preceding drawings.

Comparing FIG. 3 with FIG. 2, the second chip 200 in this second embodiment further includes a second selecting circuit S2 having two input nodes 207 and 208, which are respectively connected to the output terminal O2 and the input terminal I2, and an output node 209 connected to the input node 204 of the second internal circuit 203. The selecting circuit S2 may also comprise a well-known AND-OR-inverter gate provided with an inverter 210 connected to one of control signal input lines 211 as shown in FIG. 3. The second chip 200 is provided with a control signal input terminal C2 for supplying external control signals to the selecting circuit S2.

The operation of the second selecting circuit S2 is exactly the same as the selecting circuit S1 of the first chip 100 whose operation has been explained with reference to FIG. 2 in the first embodiment. Simply speaking, the selecting circuit S2 switches to connect the input node 204 of the second internal circuit 203 to the output node 205 or the input terminal I2 according to the changes in the level of the control signal supplied to the control signal input terminal C2. Thus, floating gates of MOS transistors or CMOS inverters of the second internal circuit 203, which are connected to the input nodes that are not used for the individual testing, can be clamped at respective appropriate potential levels, and the aforesaid problems relating to the floating gate MOS transistor or CMOS inverter can be eliminated.

In the second chip 200, since the input and output terminals I2 and O2 are formed at the peripheral region of the chip 200 together with the control signal input terminal C2, each of the terminals can be large enough to accommodate a touch of an external probe for the individual test. Therefore, the provision of the selecting circuit S2 has validity only for the solution of the problems relating to the floating gate MOS transistors or CMOS inverters in this second embodiment, however, the chip area utilization efficiency can further be increased.

Figure 4:
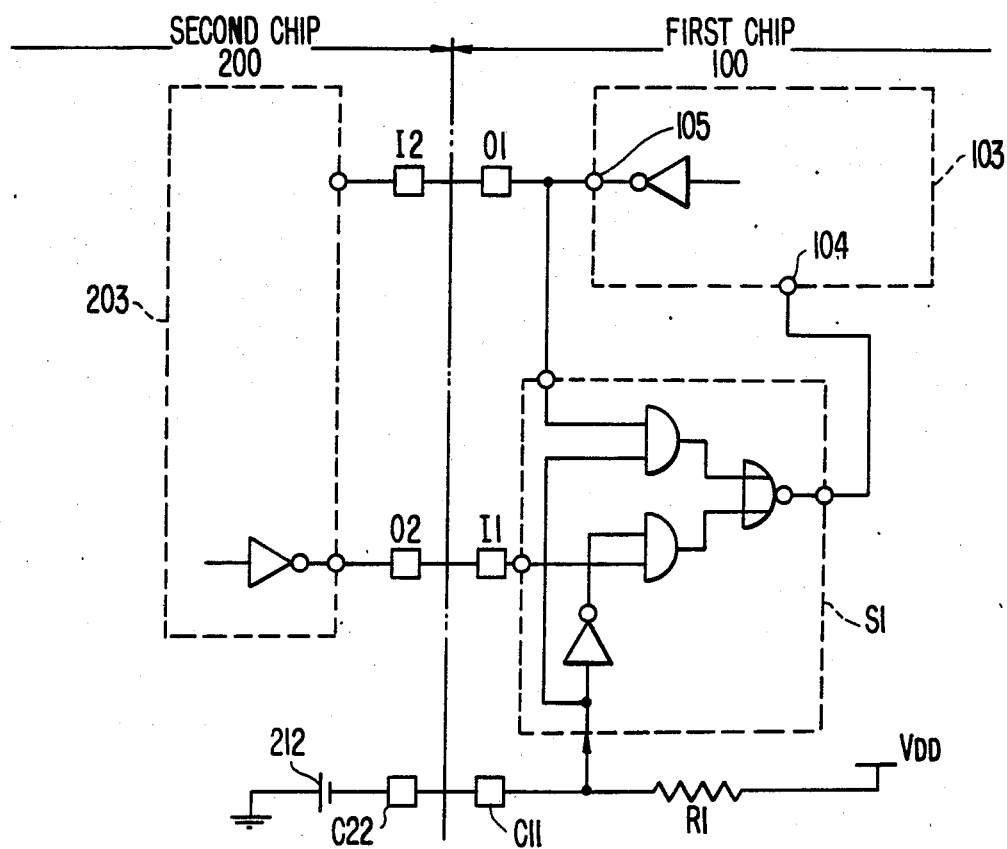
FIG. 4 is a circuit block diagram illustrating an essential part of the circuit of a chip-on-chip type semiconductor device in accordance with the third embodiment of the present invention.

FIG. 4 is a circuit block diagram illustrating an essential part of the circuit of a chip-on-chip type semiconductor device in accordance with the third embodiment of the present invention. In FIG. 4, like numerals designate like or corresponding parts in the preceding drawings. In this embodiment, the chip-on-chip type semiconductor device including the first chip 100 and the second chip 200 is provided with an impedance means R1 and a biasing means 212. The impedance means R1 having impedance of a few megohms, for example, is connected between a control signal input terminal C11 formed at the inner region of the first chip 100 and a voltage source $V_{DD}$, a positive voltage supply line, for example. The biasing means 212 has an output impedance lower than the impedance means R1 and is connected to the control signal output terminal C22. The control signal output terminal C22 is formed at the peripheral region of the second chip 200 and interconnected with the control signal input terminal C11 so as to supply a negative voltage to the control signal input terminal C11. The biasing means 212 may be a negative voltage supply line or a ground line.

In the circuit configuration of FIG. 4, the control signal input terminal C11 is clamped at high a level by the voltage source $V_{DD}$ before the chips 100 and 200 are interconnected with each other. On the contrary, when the control signal input terminals C11 and control signal output terminal C22 are connected to each other in a completed chip-on-chip structure, the control signal input terminal C11 is pulled down to a low level by the biasing means 212. Accordingly, the selecting circuit S1 switches to connect the input node 104 of the first internal circuit 103 to the output 105 during the individual test, and to the input terminal I1 of the first chip 100 during the test of the completed chip-on-chip configuration.

Thus, the switching of the selecting circuit S1 is spontaneously performed according to the situation whether the terminals C11 and C22 are interconnected to each other or not, and therefore, it is unnecessary to supply external control signals to the selecting circuit S1 via a large terminal 101 formed at the peripheral region of the chip 100, as in the preceding embodiments. As a result, the terminals C11 and C22 may be small, such as 10 micron square, for example. This means that the chip area utilization efficiency can still be increased in the embodiment of FIG. 4 compared with the preceding embodiments.

Figure 5:
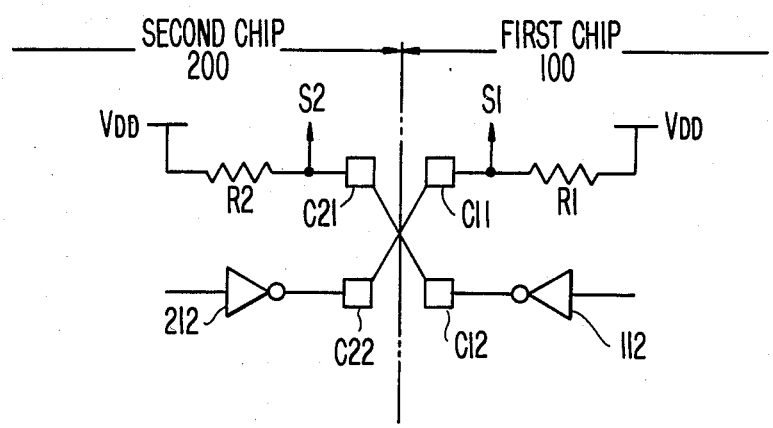
FIG. 5 is a partial circuit diagram for explaining an extended application of the the selecting circuit in FIG. 4.

FIG. 5 is a partial circuit diagram for explaining an extended application of the spontaneous switching of the selecting circuit in FIG. 4. In FIG. 5, like numerals designate like or corresponding parts in the preceding drawings. The first chip 100 and second chip 200 in FIG. 5 further include a biasing means 112 connected to another control signal output terminal C12, and an impedance means R2 connected between another control signal input terminal C21 and a voltage source $V_{DD}$, respectively. The control signal output terminal C12 is connected to the control signal input terminal C21 in a completed chip-on-chip structure. The voltage source $V_{DD}$ may a positive voltage supply line, for example. Thus, the control signal input terminal C21 is clamped at a high level by the voltage source $V_{DD}$ before the chips 100 and 200 are interconnected with each other, and pulled down to a low level by the biasing means 112 when the chips 100 and 200 are interconnected with each other in a completed chip-on-chip structure. Therefore, if the circuit of FIG. 5 is implemented in a chip-on-chip semiconductor device as shown in FIG. 3, the operation of each of the selecting circuits S1 and S2 can be spontaneously performed as explained with reference to the embodiment of FIG. 4, and the large control signal input terminal C2 in FIG. 3 can be replaced by the small terminals C21 and C22. Hence, the chip area utilization efficiency is still further increased compared with preceding embodiments.

The impedance means R1 can be formed from a diffusion layer or polysilicon layer, however, they also may be composed of FETs (field effect transistors). FIG. 5 shows an example of the use of a driver circuit for each of the biasing means 112 and 212. If the biasing means 112 and 212 are formed from FETs as well as the impedance means R1 and R2, the gate-width (W) to gate-length (L) ratios (W/L) of respective FETs for the impedance means and the biasing means are estimated as follows.

If each of the FETs for the impedance means R1 and R2 is designed to have a W/L ratio of 5/50, it is considered appropriate for each of the FETs for the biasing means 112 and 212 to have a W/L ratio larger than 50/5. Thus, the FETs for the biasing means 112 and 212 are provided with a $\beta$ value (a voltage-independent factor relating to transmission conductance $g_m$ and relative to the W/L ratio) 100 times larger than that of the impedance FETs, and with a sufficient driving capability for the pull-down operation.

Figure 6:
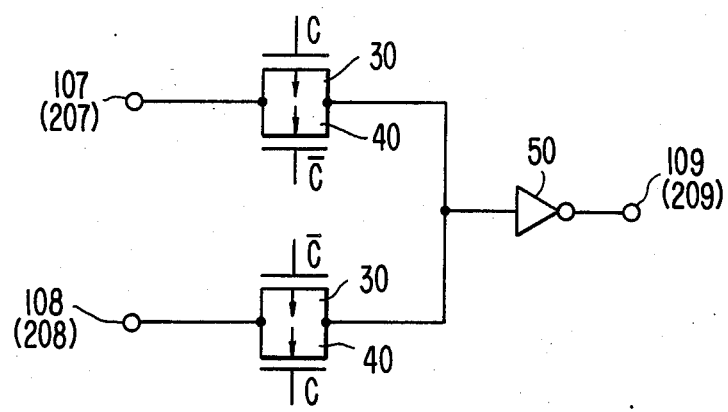
FIG. 6 is a circuit diagram of a transfer gate which can be used as the selecting circuit in the embodiments of the present invention.

FIG. 6 is a circuit diagram illustrating another configuration of the selecting circuit applicable to every embodiment of the present invention. In FIG. 6, like numerals designate like or corresponding parts in the preceding embodiments. The selecting circuit of FIG. 6 comprises two pairs of transistors, each pair including a p-channel transistor 30 and a n-channel transistor 40 which are connected in parallel to each other to form a transfer gate, and an inverter 50. The p- and n-channel transistor pairs have respective common sources or drains connected to input nodes 107 (or 207) and 108 (or 208), respectively, and respective common drains or sources which are commonly connected to the input of the inverter 50 having an output connected to an output node 109 (or 209).

The selecting circuit of FIG. 6 switches to select input signals on the input 107 (207) or 108 (208) according to the change between the incoming high level control signal C and low level control signal $\overline{C}$. Thus, signals on the selected input node 107 (207) or 108 (208) are transmitted to the output node 109 (or 209). The high and low level control signals are externally supplied via the control signal input terminal C1 or C2 in FIG. 2 or 3, or the high level control signal C and the low level control signal $\overline{C}$ are respectively supplied by the voltage source $V_{DD}$ and the biasing means 112 or 212 of FIG. 4 or 5.

It is obvious for those skilled in the art that the selecting circuit, impedance means and biasing means in the above embodiments can be fabricated with the same technology used for the circuit formed on the relevant chip.

Figure 7:
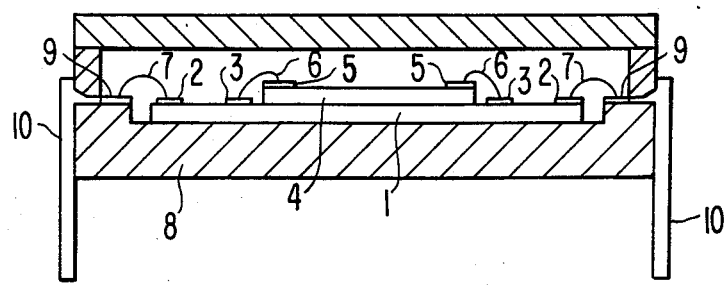
FIG. 7 is a cross-section of a chip-on-chip type semiconductor device package containing chips fabricated according to the present invention.

FIG. 7 is a cross-section of a chip-on-chip semiconductor device package having the first and second chips fabricated according to the present invention. Referring to FIG. 7, the first chip 1 is disposed on a substrate 8 and the second chip 4 is mounted thereon in a face-up condition. The first and second chips are wired with each other by wirings 6 through respective terminals 3 and 5 formed on the chips 1 and 4. Each terminal 2 formed at the peripheral region of the first chip 1 is connected to an internal lead 9 of a metallized layer formed in the package with corresponding wiring 7. Each of the internal leads 9 is connected to corresponding one of external leads 10 formed outside of the package. Reference 11 designates a lid of the package. Each of the wirings 6 between the chips 1 and 4 can be replaced by a conductor layer formed on the chips 1 and 4 and covering the step between chips 1 and 4.

While the embodiments of the invention herein set forth represent preferred forms of practice of the present invention, it is to be understood that modifications and adaptations will occur to those skilled in the art. Thus, it is intended by the appended claims to encompass all such modifications and adaptations as fall within the true spirit and scope of the present invention.

I claim:

1. A semiconductor device including a first chip and a second chip mounted on said first chip, said first and second chips having first and second internal circuits formed thereon, respectively, said first chip comprising:

an input node and an output node provided for said first internal circuit;

and input terminal and an output terminal formed at an inner region of said first chip, said input terminal being for receiving incoming signals from said second internal circuit, and said output terminal being connected to said output node of said first internal circuit;

a selecting circuit having first and second input nodes and an output node, said first and second input nodes of said selecting circuit being connected to said output terminal and said input terminal, respectively, and said output node of said selecting circuit being connected to said input node of said first internal circuit; and a control signal input terminal for receiving a control signal for controlling said selecting circuit, said control signal input terminal being formed at a peripheral region of said first chip and connected to said selecting circuit, wherein said selecting circuit switches said input node of said first internal circuit to connect to said input terminal or to said output terminal, according to said control signal.

2. A semiconductor device as set forth in claim 1, said selecting circuit comprising a gate circuit having two inputs and an inverter, wherein said inverter and a first of said inputs of said gate circuit is each connected to receive said control signal, and the second of said inputs of said gate circuit is connected to the output of said inverter.

3. A semiconductor device as set forth in claim 1, said selecting circuit comprising two transfer gates, each with a respective input connected to a respective one of said input nodes of said selecting circuit, and first and second inverters, wherein said transfer gates have a common output connected as an input to said first inverter, said control signal is provided as an input to said second inverter and at least one respective one of said control signal and its inverse output from said second inverter is provided to each said transfer gate.

4. A semiconductor device including a first chip and a second chip mounted on said first chip, said first and second chips having first and second internal circuits formed thereon, respectively, said first chip comprising:
an input node and an output node provided for said first internal circuit;
an input terminal and an output terminal formed at an inner region of said first chip, said input terminal being for receiving incoming signals from said second internal circuit, and said output terminal being connected to said output node of said first internal circuit;
a selecting circuit having first and second input nodes and an output node, said first and second input nodes of said selecting circuit being connected to said output terminal and said input terminal, respectively, and said output node of said selecting circuit being connected to said input node of said first internal circuit;
a control signal input terminal for receiving a control signal for controlling said selecting circuit, said control signal input terminal being formed at said inner region of said first chip and connected to said selecting circuit; and
impedance means connected between said control signal input terminal and a voltage source, said impedance means having a limited impedance, and said second chip comprising:
a control signal output terminal for connection to said control signal input terminal of said first chip; and
biasing means formed on said second chip, said biasing means being connected to said control signal output terminal of said second chip for clamping said control signal input terminal of said first chip at a predetermined voltage after completion of wiring to connect between said control signal output terminal of said second chip and said control signal input terminal of said first chip;
wherein said selecting circuit switches said input node of said first internal circuit between said output and terminals of said first chip according to a voltage supplied from said voltage source through said impedance means before the completion of wiring between said control signal input terminal of said first chip and said control signal output terminal of said second chip, and said selecting circuit switches said input node of said first internal circuit between said input and output terminals of said first chip according to said predetermined voltage supplied from said biasing means after the completion of wiring between said control signal input terminal of said first chip and said control signal output terminal of said second chip.

5. A semiconductor device as set forth in claim 4, wherein said control signal output terminal is formed at a peripheral region of said second chip.

6. A semiconductor device as set forth in claim 4, wherein said biasing means is a driver circuit having an output connected to said control signal output terminal of said second chip and an input connected to a voltage supply line, and said driver circuit has an output impedance lower than the impedance of said impedance means of said first chip.

7. A semiconductor device as set forth in claim 4, said selecting circuit comprising an inverter and a gate circuit having two inputs, wherein said control signal is provided as a first input to said gate circuit and as an input to said inverter, and said gate circuit has a second input which is the output of said inverter.

8. A semiconductor device as set forth in claim 4, said selecting circuit comprising first and second inverters and two transfer gates, wherein said transfer gates have a common output connected as an input to said first inverter, and said control signal is provided as an input to a first one of said transfer gates and to said second inverter, and the other one of said transfer gates has as an input the output of said second inverter.

9. A semiconductor device as set forth in claim 4, wherein said impedance means is a MIS transistor having a source and a drain connected between said control signal input terminal of said first chip and said voltage source, and said MIS transistor has a gate clamped at a predetermined voltage.

10. A semiconductor device as set forth in claim 4, wherein said voltage source is a power supply line.

11. A semiconductor device as set forth in claim 3, wherein each said transfer gate comprises a pair of transistors connected in parallel and controlled by said control signal and its inverse, each said pair of transistors including a p-channel transistor and an n-channel transistor, and said control signal and its inverse are oppositely connected to the respective pairs of transistors of said two transfer gates.

12. A semiconductor device as set forth in claim 8, wherein each said transfer gate comprises a pair of transistors connected in parallel and controlled by said control signal and its inverse, each said pair of transistors including a p-channel transistor and an n-channel transistor, and said control signal and its inverse are oppositely connected to the respective pairs of transistors of said two transfer gates.

13. A semiconductor device as set forth in claim 4, wherein said voltage source connected to said impedance means is located on said first chip.

14. A chip-on-chip device, comprising
a first chip and a second chip mounted on said first chip,
each said chip having a respective internal circuit formed thereon, each said internal circuit having at least one respective input and one respective output,
at least said first chip having a selecting circuit formed thereon, said selecting circuit having at least two inputs and one output and a control signal terminal, said output of said selecting circuit being connected to said input of said internal circuit of said first chip, a first of said at least two inputs of said selecting circuit being connected to said output of said internal circuit of said first chip, and said selecting circuit receiving a control signal input at said control signal terminal, at least one output terminal and at least one input terminal located at an interior position of said first chip, respectively connected to said output of said internal circuit of said first chip and to said second input of said selecting circuit, at least one input and output terminal located on said second chip, said input terminal of said second chip being operatively connected to said input of said internal circuit of said second chip, and said output terminal of said second chip being connected to said output of said internal circuit of said second chip, wherein said selecting circuit can be operated to switch operative connection of said input of said internal circuit of said first chip between said output terminal of said first and second chips.

15. A chip-on-chip device, comprising a first chip and a second chip mounted on said first chip, a respective circuit on each said chip, including respective terminals on each said chip for predetermined interconnection with wiring between said circuits of said two chips to provide an integral circuit, control means for providing first respective clamping voltages and current paths on at least one of said chips for testing said circuit of said at least one chip, connected to the circuit of said at least one chip, and second respective clamping voltages and current paths for testing said integral circuit, said control means being operatively automatically activated depending upon the presence or not of said wiring of said predetermined interconnection, wherein said circuit of said at least one chip can be tested individually, and said circuits of said chips can be tested as said integral circuit after said predetermined interconnection when said wiring is completed.

* * * * *

UNITED STATES PATENT AND TRADEMARK OFFICE
CERTIFICATE OF CORRECTION

PATENT NO. : 4,697,095

DATED : September 29, 1987

INVENTOR(S) : Shigeru Fujii

It is certified that error appears in the above-identified patent and that said Letters Patent is hereby corrected as shown below:

Col. 1, line 49, "circuit (second" should be --circuit, namely a second--;

line 50, delete "namely a";

line 50, "shawn" should be --shown--;

line 52, "circuit (first" should be --circuit, namely a first--;

line 53, "shown)." should be --shown.--.

Col. 2, line 30, "lines" should be --line--;

line 51, "tradeoff" should be --trade off--;

line 60, "of chips" should be --of the chips--.

Col. 3, line 5, "of" should be --on--;

UNITED STATES PATENT AND TRADEMARK OFFICE
CERTIFICATE OF CORRECTION

PATENT NO. : 4,697,095

DATED : September 29, 1987

INVENTOR(S) : Shigeru Fujii

It is certified that error appears in the above-identified patent and that said Letters Patent is hereby corrected as shown below:

line 10, "chip," should be --chip--;

line 12, "chip" should be --chip,--;

line 20, "to" should be --for--.

Col. 5, line 35, "small" should be --small,--;

line 35, after "10", insert --a--.

Col. 7, line 18, "may" should be --may be--.

Col. 8, line 49, "and" (first occurrence) should be --an--.

Col. 9, line 60, after "and", insert --input--.

Signed and Sealed this

Sixteenth Day of August, 1988

Attest:

DONALD J. QUIGG

Attesting Officer      Commissioner of Patents and Trademarks